(12) United States Patent
Hong et al.

(10) Patent No.: US 7,638,851 B2
(45) Date of Patent: Dec. 29, 2009

(54) SEMICONDUCTOR DEVICE IN PERIPHERAL CIRCUIT REGION USING A DUMMY GATE

(75) Inventors: Hee Bum Hong, Seoul (KR); Seong Taik Hong, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 111 days.

(21) Appl. No.: 11/853,528

(22) Filed: Sep. 11, 2007

(65) Prior Publication Data

US 2008/0296699 A1 Dec. 4, 2008

(30) Foreign Application Priority Data

May 31, 2007 (KR) .................. 10-2007-0053112

(51) Int. Cl.
*H01L 27/088* (2006.01)
*H01L 21/28* (2006.01)

(52) U.S. Cl. ........... 257/390; 257/E27.06; 257/E21.177

(58) Field of Classification Search ............... 257/390, 257/355; 438/261
See application file for complete search history.

(56) References Cited

U.S. PATENT DOCUMENTS

2003/0057496 A1* 3/2003 Shiau et al. ................. 257/355
2007/0004147 A1* 1/2007 Toubou et al. .............. 438/261

* cited by examiner

*Primary Examiner*—Fernando L Toledo
*Assistant Examiner*—Mamadou Diallo
(74) *Attorney, Agent, or Firm*—Ladas & Parry LLP

(57) ABSTRACT

A semiconductor device in a peripheral circuit region includes a semiconductor substrate having a plurality of active areas which are disposed distantly from each other; a gate pattern including at least one gate disposed on the active area; a dummy gate disposed between the active areas and first and second pads; first and second pads connected to both sides of the gate and the dummy gate, respectively; and a first wiring formed so as to be in contact with at least one of the first and second pads.

17 Claims, 15 Drawing Sheets

SEMICONDUCTOR DEVICE IN PERIPHERAL CIRCUIT REGION USING A DUMMY GATE

CROSS-REFERENCE TO RELATED APPLICATIONS

The present application claims priority to Korean patent application number 10-2007-0053112 filed on May. 31, 2007, which is incorporated herein by reference in its entirety.

BACKGROUND OF THE INVENTION

The present invention relates to a semiconductor device, and more particularly, to a semiconductor device in a peripheral circuit region where the layout area can be decreased.

As semiconductor devices near high integration, high speed, low power consumption, and compact sizes, the design-rule for a MOSFET device under development has been continuously decreased. Accordingly, the size of a gate has been continuously decreased. This trend has decreased the size of a gate in a semiconductor device in a cell as well as in a peripheral circuit region. Particularly, the size of a gate in the peripheral circuit required by a 60 nm technology has been decreased to about 100 nm.

As a result, the existing planar transistor structure limits a threshold voltage (Vt) target of a MOSFET device that is required by a specific device.

There are many difficulties in forming a gate pattern. For example, the actual size of a gate used may be smaller than the target size resulting in a nonuniform gate profile where a gate layout is formed without a dummy gate.

Thus, in order to solve these difficulties, dummy gates having the same length and width as the actual gate are used when performing a gate layout. Such dummy gates are arranged with equal spaces as the actually used gate allowing for a true gate target for performing the gate layout.

FIG. 1 is a view illustrating a layout of a peripheral circuit region in accordance with the prior art. As shown, a circuit requiring high speed operation employs a structure where gate pads 130 and 140 are disposed at either end of the surface of the gate respectively and a bit line 150 that is connected to the gate pads 130 and 140 simultaneously to prevent variation of the turn-on speed of the gate when a gate 120 that is disposed on an active area 110 of a semiconductor substrate 100 is turned on.

In FIG. 1, reference symbols 160 and 170, which are not explained, denote metal wirings.

However, in the peripheral circuit region in accordance with the prior art, distances between the gates are not regular since the bit lines are disposed according to the spacing of a design-rule. As such, if the distances between the gates are not regular, it is difficult to pattern a gate in a photolithography process when performing a gate layout.

In order to solve the difficulty of gate patterning as described above, a dummy gate should be used when performing a gate layout. However, it is impossible to insert the dummy gate when performing a gate layout because the gate pads are disposed at both sides of the active area.

If the dummy gate is inserted when performing a gate layout, a space between the active areas in which the dummy gate is inserted is increased, which consequently results in an increase of a layout area of the device.

BRIEF SUMMARY OF THE INVENTION

Embodiments of the present invention are directed to a semiconductor device with a peripheral circuit region in which a layout area can be decreased.

In one embodiment, a semiconductor device in a peripheral circuit region may include a semiconductor substrate having a plurality of active areas which are disposed distantly from each other; a gate pattern including at least one gate disposed on the active area, a dummy gate disposed between the active areas, and first and second pads connected with first side portions and second side portions of the gate and the dummy gate, respectively; and a first wiring formed to contact at least one of the first and second pads.

The dummy gate has the same width and length as the gate.

A space between the gates and a space between the gate and the dummy gate are equal.

A space between the dummy gate and a gate disposed on another active area adjacent to the dummy gate is equal to a space between the gates disposed on the first active area.

At least one area of the first wiring is in contact with either of the first or second pads.

The semiconductor device in a peripheral circuit region may further comprise a second wiring and a third wiring disposed at both sides of the gate and in contact with the active area.

The first wiring is disposed in a linear direction extending from either of the second wiring or the third wiring which crosses over the first or second pad.

The second wiring and the third wiring are arranged with equal spaces.

The semiconductor device in a peripheral circuit region may further comprise a second wiring disposed between the gate and the dummy gate and between the dummy gate and the gate disposed on a second active area adjacent thereto and in contact with the active area.

In another embodiment, a semiconductor device in a peripheral circuit region may comprise a semiconductor substrate having a plurality of active areas which are disposed distantly from each other; a gate pattern including at least one gate disposed on the active area, a dummy gate disposed between the active areas, and a pad connected with first side portions and second side portions of the gate and the dummy gate; and a first wiring formed to contact a portion of the pad corresponding to either a first area between the gates and a second area between the gate and the dummy gate.

The dummy gate has the same width and length as the gate.

A space between the gates and a space between the gate and the dummy gate are equal.

A space between the dummy gate and a gate disposed on a second active area adjacent to the dummy gate is equal to a space between the gates disposed on the first active area.

The first wiring is in contact with at least one area of the pad.

The semiconductor device in a peripheral circuit region may further comprise a second wiring and a third wiring disposed at both sides of the gate and contact the active area.

The second wiring and the third wiring are arranged with equal spaces.

The semiconductor device in a peripheral circuit region may further comprise a second wiring disposed between the gate and the dummy gate and between the dummy gate and the gate disposed on a second active area adjacent thereto and be in contact with the active area.

DESCRIPTION OF SPECIFIC EMBODIMENTS

A preferred embodiment of the present invention is directed to a semiconductor device in a peripheral circuit region in which a gate pattern includes at least one gate disposed at an active area of a semiconductor substrate and pads connected to either side portions of the gate. A dummy gate is disposed between the active areas formed during the manufacturing thereof.

Therefore, in an embodiment of the present invention, the dummy gate has the same shape as the gate that is formed between the active areas when forming the gate pattern. Consequently, the spaces between the gates can be kept uniform due to the dummy gates.

The difficulty of a photolithography process in forming the gate pattern is solved by the dummy gate and is helpful to stabilization of the gate pattern.

In an embodiment of the present invention, a metal wiring through which electric voltage is applied, is formed to contact the pads between the gates and between the gate and the dummy gate allowing the size of a semiconductor device layout to be reduced compared to the prior art. Thus, the metal wiring is not disposed between the active areas.

Figure 1:
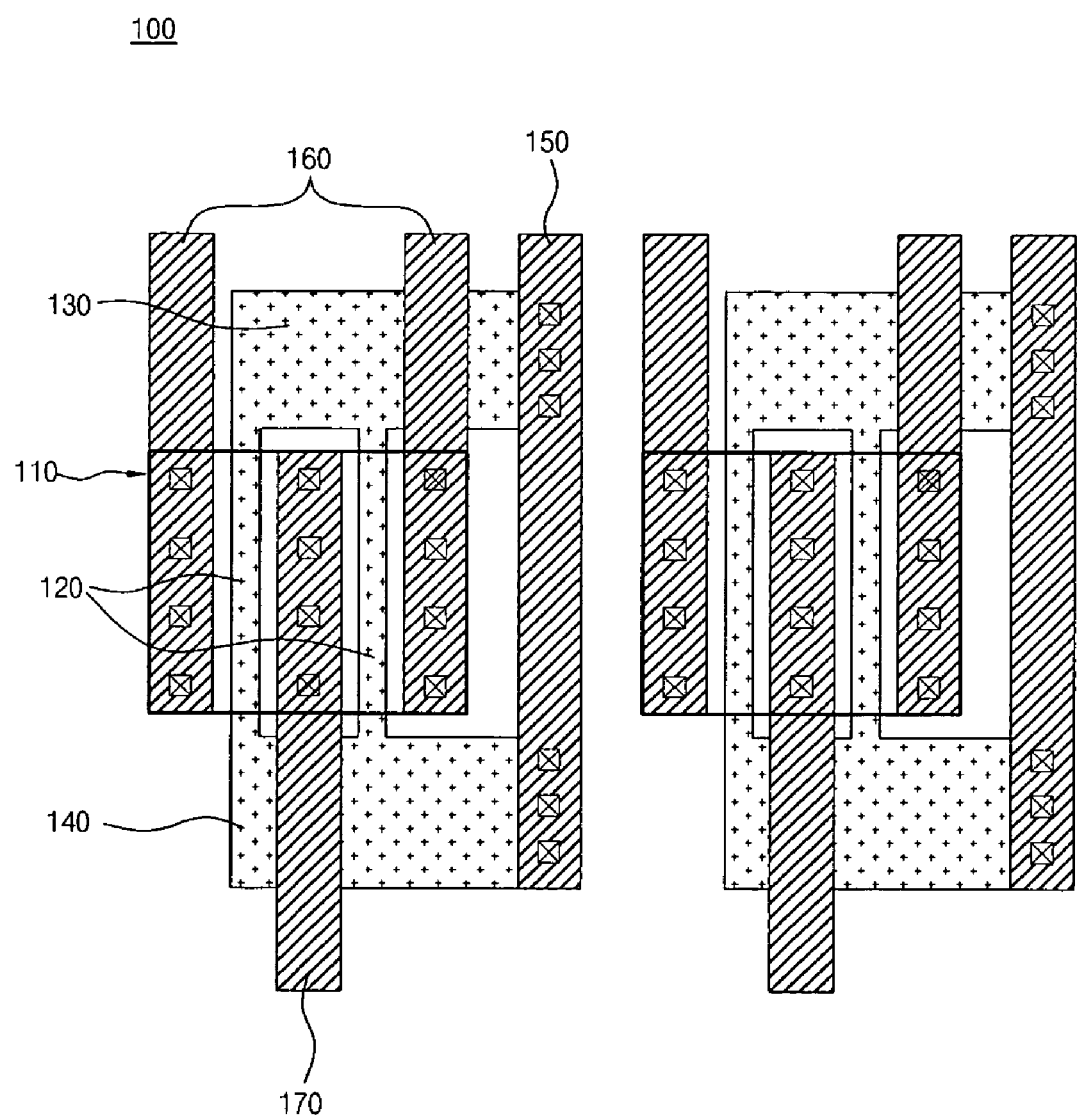
FIG. 1 is a layout illustrating a semiconductor device in a peripheral circuit region in accordance with a prior art.
Figure 2:
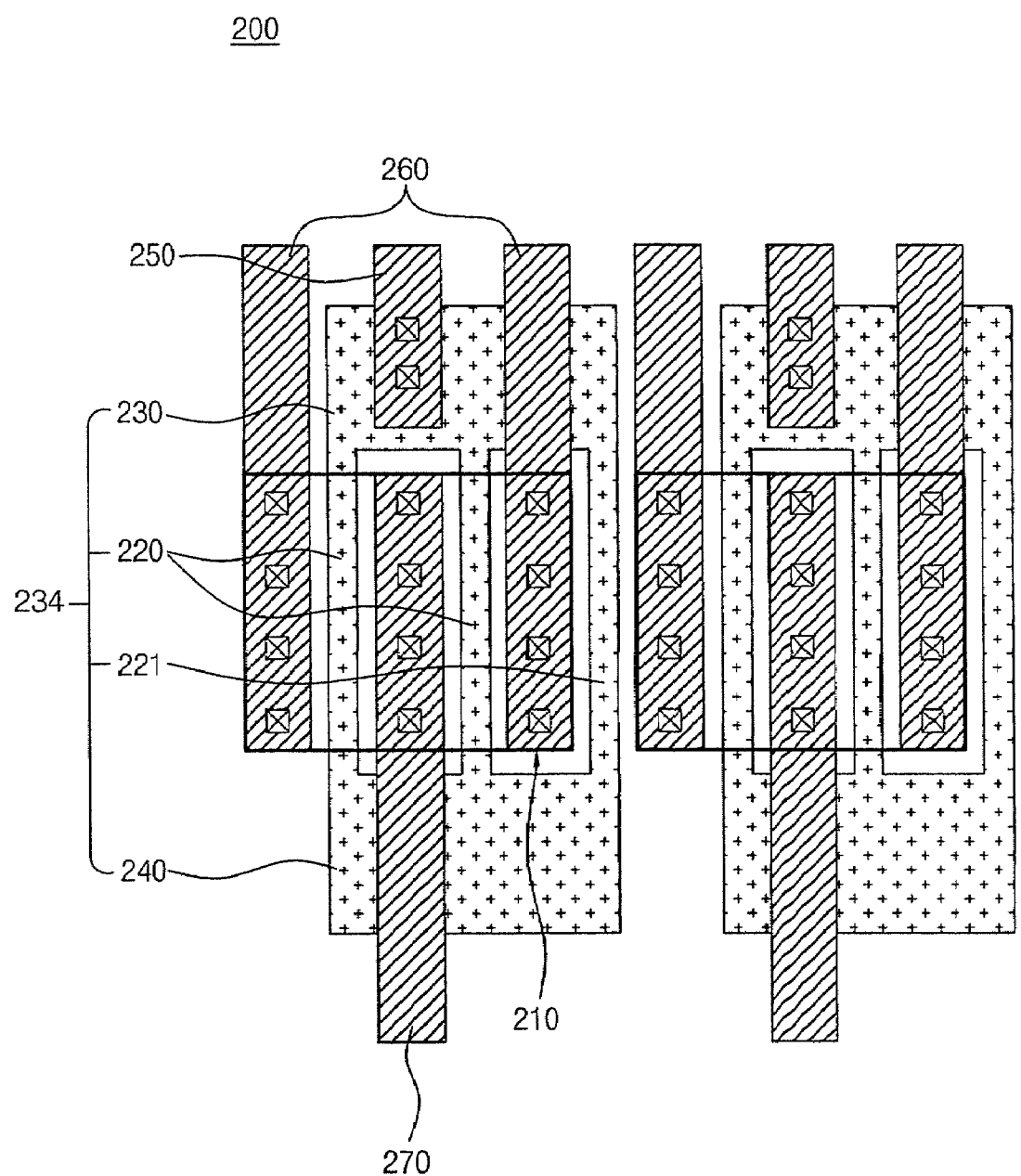
FIG. 2 is a layout illustrating a semiconductor device in a peripheral circuit region in accordance with a first embodiment of the present invention.

FIG. 2 is a layout illustrating a semiconductor device in a peripheral circuit region in accordance with a first embodiment of the present invention.

As shown, the semiconductor device in a peripheral circuit region has a structure including a semiconductor substrate 200 having a plurality of active areas 210 that are disposed distantly from each other. The device further includes a gate pattern having at least one gate 220 disposed at the active area 210, a first pad 230 and a second pad 240 connected to the side portions of the gates 220 and dummy gate 221, and a first wiring 250 that is formed so as to contact either of the first and second pads 230 and 240.

In the semiconductor device in a peripheral circuit region in accordance with the present invention as described above, when forming the gate pattern 234, the gate 220 disposed within the active areas 21 is turned on by connecting the first pad 230 and the second pad 240 through the dummy gate 221.

Figure 3A:
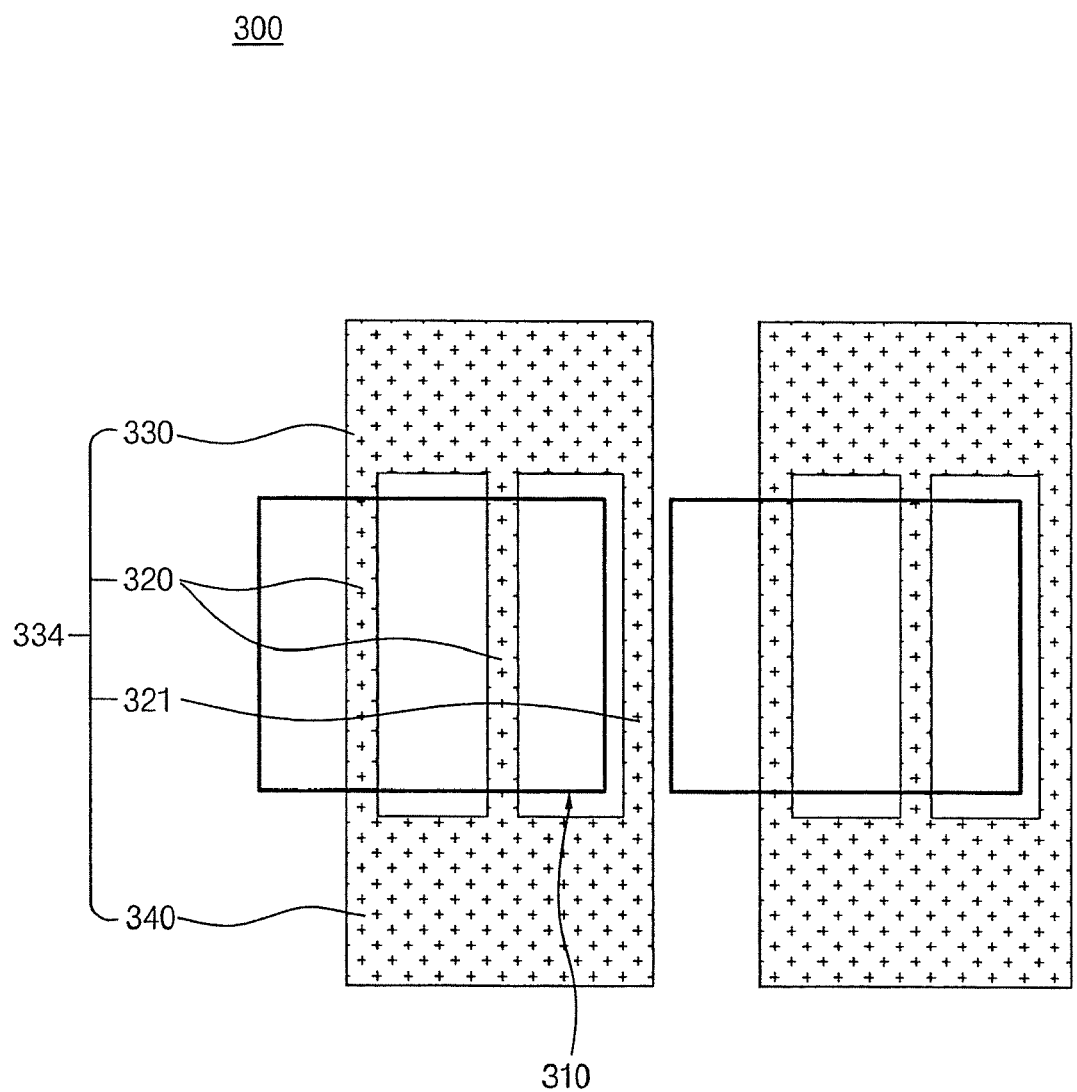
FIGS. 3A through 3C are layouts illustrating the steps for manufacturing the semiconductor device in a peripheral circuit region in accordance with the first embodiment of the present invention.
Figure 3B:
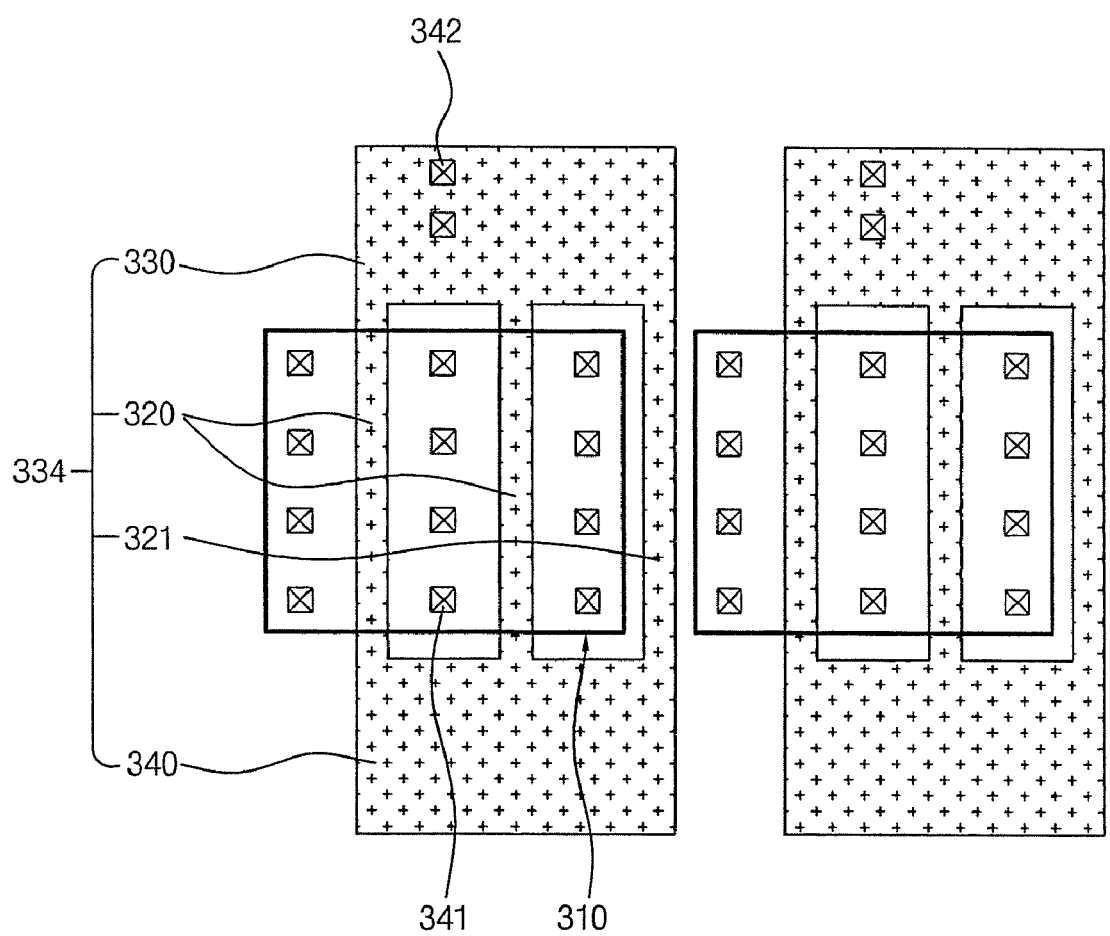
Figure 3C:
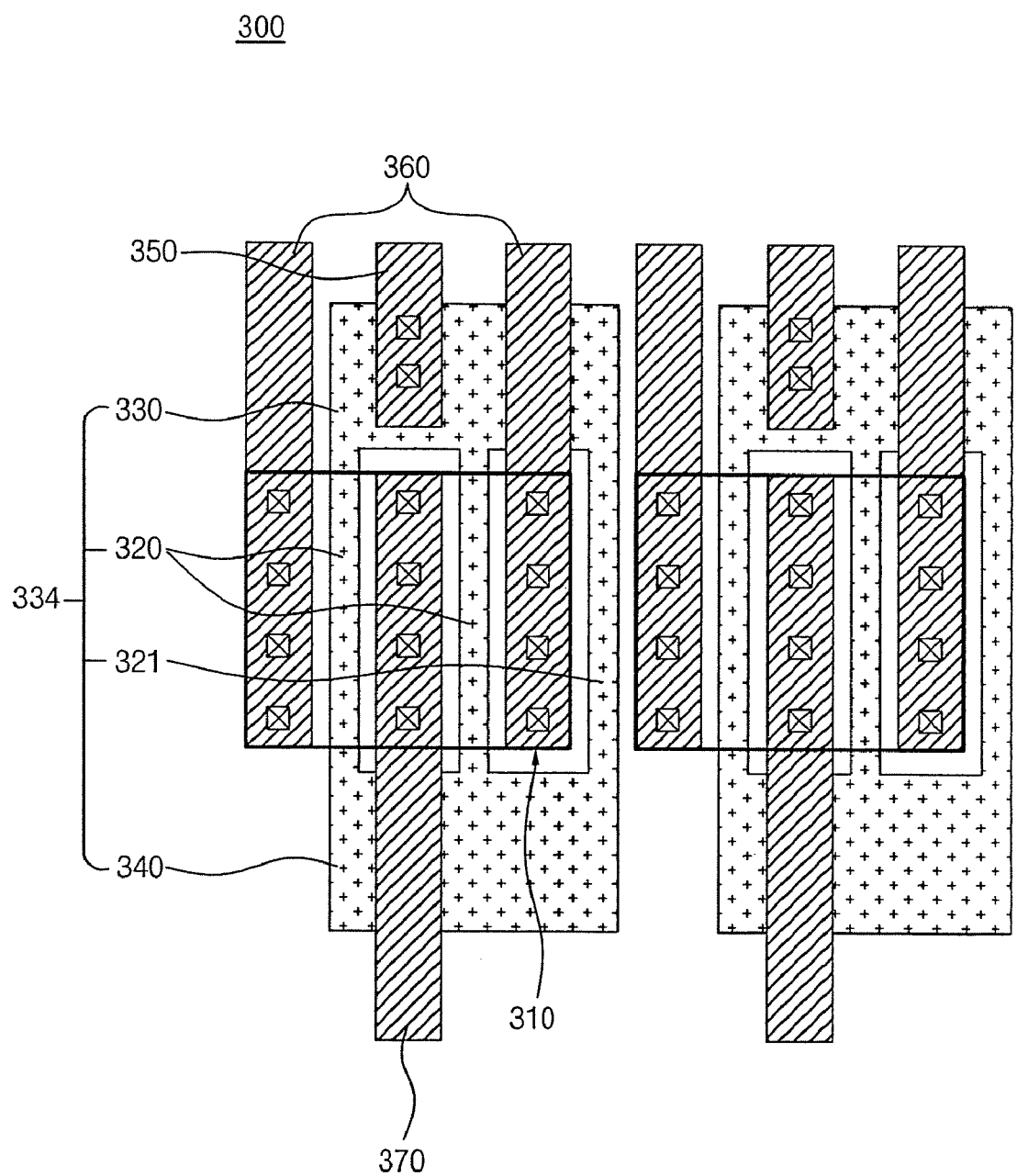

FIGS. 3A through 3C are layouts illustrating the process steps for manufacturing the semiconductor device in a peripheral circuit region in accordance with the first embodiment of the present invention and a detailed description with reference to the drawings will be made.

Referring to FIG. 3A, at least one gate 320 is formed on each active area 310 of a semiconductor substrate 300 having a plurality of active areas 310. Preferably, the gate 320 is formed in pairs in the active area.

Subsequently, a dummy gate 321 is formed having the same width and length as the gate 320 between the active areas 310.

Further, the space between the dummy gate 321 disposed at one active area 310 and a gate disposed at a second active area 310 adjacent to the dummy gate 321, is equal to the space between the gates 320 disposed on one active area 310 and the space between the gate 320 and the dummy gate 321. Thus, spaces between the gates 320 can be kept uniform, as the dummy gate 321 is disposed.

Subsequently, a first pad 330 and a second pad 340 are formed so as to connect with both side portions of the gates 320 and the dummy gate 321, thereby forming a gate pattern 334 including the gate 320, the dummy gate 321, the first pad 330 and the second pad 340. Subsequently, a source/drain area (not shown) is formed in the active area at both sides of the gate 320.

Referring to FIG. 3B, there is a first contact 341 for metal wiring that is in contact with the source/drain area of the semiconductor substrate 300. The first contact 341 for metal wiring is formed so that at least one spot thereof is in contact with the active area 310 along a direction perpendicular to the active area 310. Preferably, the first contact 341 for metal wiring is formed to contact three spots of the active area 310 along the direction of the active area 310 and in contact with four spots of the active area 310 along a direction perpendicular to the active area 310.

A second contact 342 for metal wiring is formed on the first pad 330 or the second pad 340. The second contact 342 for metal wiring is formed to contact with two spots of the first pad 330 or the second pad 340.

Referring to FIG. 3C, a first wiring 350 is formed to contact at least one spot of the second contact 342 for metal wiring formed on the first pad 330 or the second pad 340. Preferably, the first wiring 350 is formed to contact with two spots of the first pad 330.

A second wiring 360 and a third wiring 370 are formed and disposed at both sides of the gate 320 and to contact the active area. Preferably, the second wirings 360 are formed as a pair outside of the gates 320 so as to contact the source area. The third wiring 370 is formed between the pair of gates 320 so as to contact the drain area.

The second wirings 360 and the third wiring 370 are arranged with equal spacing. In addition, the spacing among the first wiring 350, the second wirings 360 and the third wiring 370 are equal to one another. Also, the spacing among the first wiring 350, the second wirings 360 and the third wiring 370 are equal to a space between the active areas 310.

Further, since the second wirings 360 and the third wiring 370 are formed on the first contact 341 for metal wiring, the second wirings 360 and the third wiring 370 are in contact with four spots of the active area 310 respectively.

Afterwards, though not shown, a series of known follow-up processes are sequentially performed thereby manufacturing the semiconductor device in a peripheral circuit region in accordance with the first embodiment of the present invention.

As described above, in the manufacture of the semiconductor device in a peripheral circuit region in accordance with the first embodiment of the present invention, the first wiring 350 is formed in a line extending over the first pad 330 parallel to the second and third wirings 360 and 370 and is preferably formed laterally in line with the third wiring 370 which crosses the first pad 330 to contact the two spots of the first pad 330. However, in a second embodiment of the present invention, as shown in FIG. 4, the first wiring 450 may be formed laterally in line with the second wiring 460 which crosses the second pad 440 to contact the two spots of the second pad 440.

Figure 4:
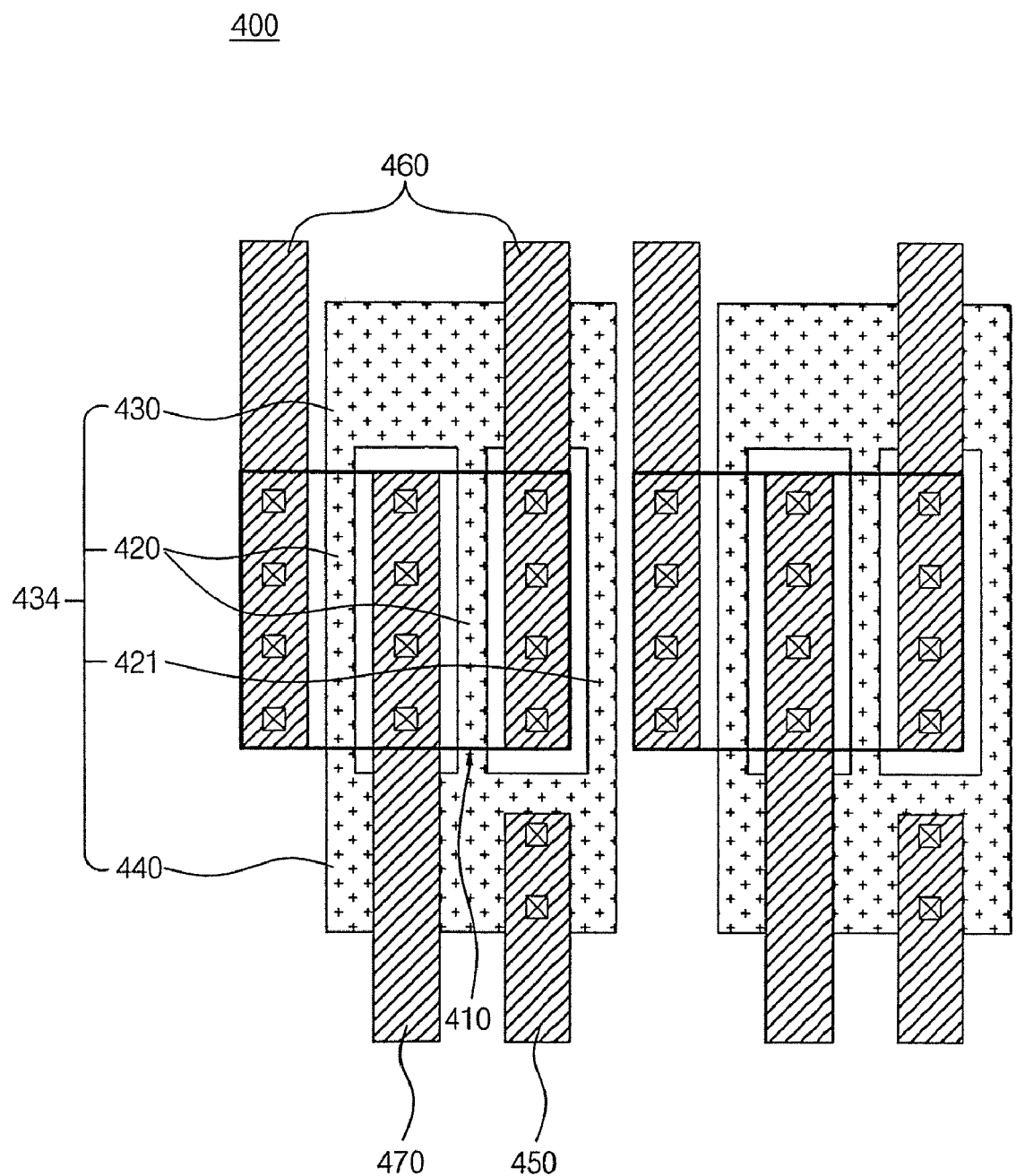
FIG. 4 is a layout illustrating a semiconductor device in a peripheral circuit region in accordance with a second embodiment of the present invention.

In FIG. 4, reference symbols 400, 410, 420, 421, 430, 434 and 470, which are not explained, denote a semiconductor substrate, an active area, a gate, a dummy gate, a gate pattern and a third wiring, respectively.

Also, in the semiconductor device in a peripheral circuit region in accordance with the first embodiment of the present invention, the second wiring 360 and the third wiring 370 are formed and disposed at both sides of the gate 320 to contact the active area 310. However, in a third embodiment of the present invention, as shown in FIG. 5, a second wiring 560 alone may contact the active area 510 and be disposed between a gate 520 and a dummy gate 521 and also between the dummy gate 521 and gate 520 disposed on another active area 510 adjacent thereto.

Figure 5:
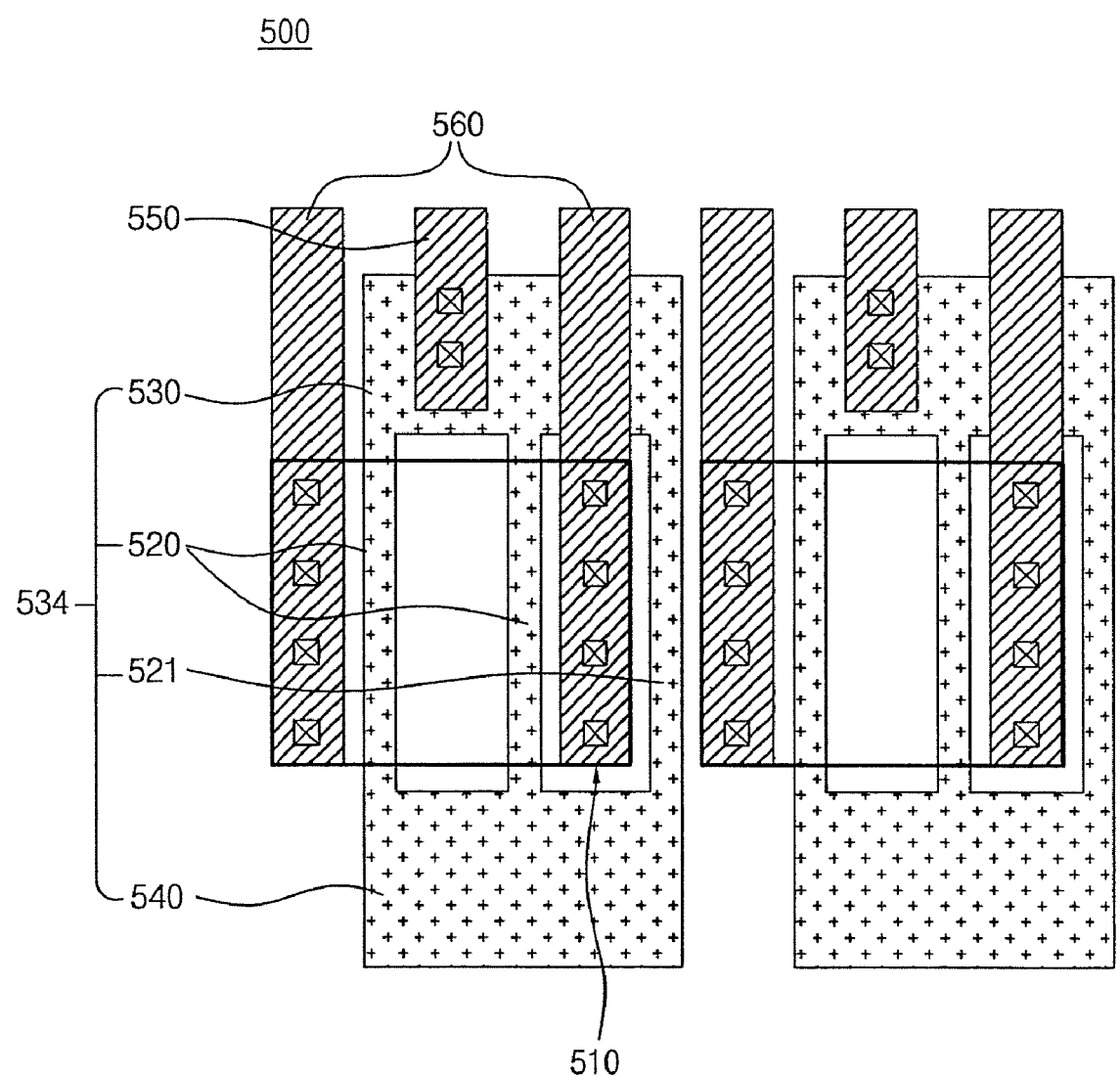
FIG. 5 is a layout illustrating a semiconductor device in a peripheral circuit region in accordance with a third embodiment of the present invention.

In FIG. 5, reference symbols 500, 530 and 540, 534 and 550, which are not explained, denote a semiconductor substrate, pads, a gate pattern and a first wiring, respectively.

As described above, in an embodiment of the present invention, since a dummy gate which connects the first pad and the second pad and has the same shape as the gate is formed between the active areas when forming the gate pattern, the size layout can be reduced in comparison to a semiconductor device in accordance with the prior art in which a first pad and a second pad are connected through a bit line.

Also, in an embodiment of the present invention, the dummy gate is helpful in stabilization of the gate pattern.

Specifically, a conventional layout of a MOSFET device requiring high speed employs a structure such that gate pads are disposed at the sides of a gate and a bit line is connected to the gate pad. The gate is turned on by its connection to the pad through the bit line.

This is due to the resistance of the bit line that is about ⅓ than that of a tungsten silicide (WSix) gate where tungsten is used for the bit line as in the prior art. It is beneficial to turn on the gate through the bit line having a low resistance when connecting the pad connected with the gate to the bit line.

However, in the conventional MOSFET device, since the pad is structured to be connected to bit line, distances between the gates are not regular due to the bit line. Thus, gate patterning in a photolithography process when performing gate layout is difficult.

Meanwhile, it is possible to solve this gate patterning difficulty by using a dummy gate, but it is difficult to insert the dummy gate due to the pad being connected to the gate.

If the dummy gate is inserted when performing gate layout, spaces between active areas in which the gate and the dummy gate are inserted is increased further which consequently results in an increase in the layout size of a device.

Therefore, the present invention uses a manner of turning on the gate not by connecting it to the pad through the bit line, but rather by connecting it to the pad through the dummy gate as described above.

As such, the reason that it is possible to connect the pad through the dummy gate instead of the bit line in an embodiment of the present invention is as follows: because tungsten, which has a lower resistance, is used instead of tungsten silicide as the metal material of the gate, and as a design-rule of a semiconductor device is reduced to less than 60 nm, thus gate resistance has been reduced to a level of the bit line using tungsten, it is possible to connect the pad through the dummy gate using a gate having the same level of resistance as the bit line instead of a bit line.

Therefore, in an embodiment of the present invention, since a semiconductor device in a peripheral circuit region in which the pad is connected through a dummy gate using a gate instead of a bit line is employed, the structure is not largely different from the prior structure described where the pad is connected through a bit line. However, it is possible to reduce a total layout size compared to the prior art.

Figure 6:
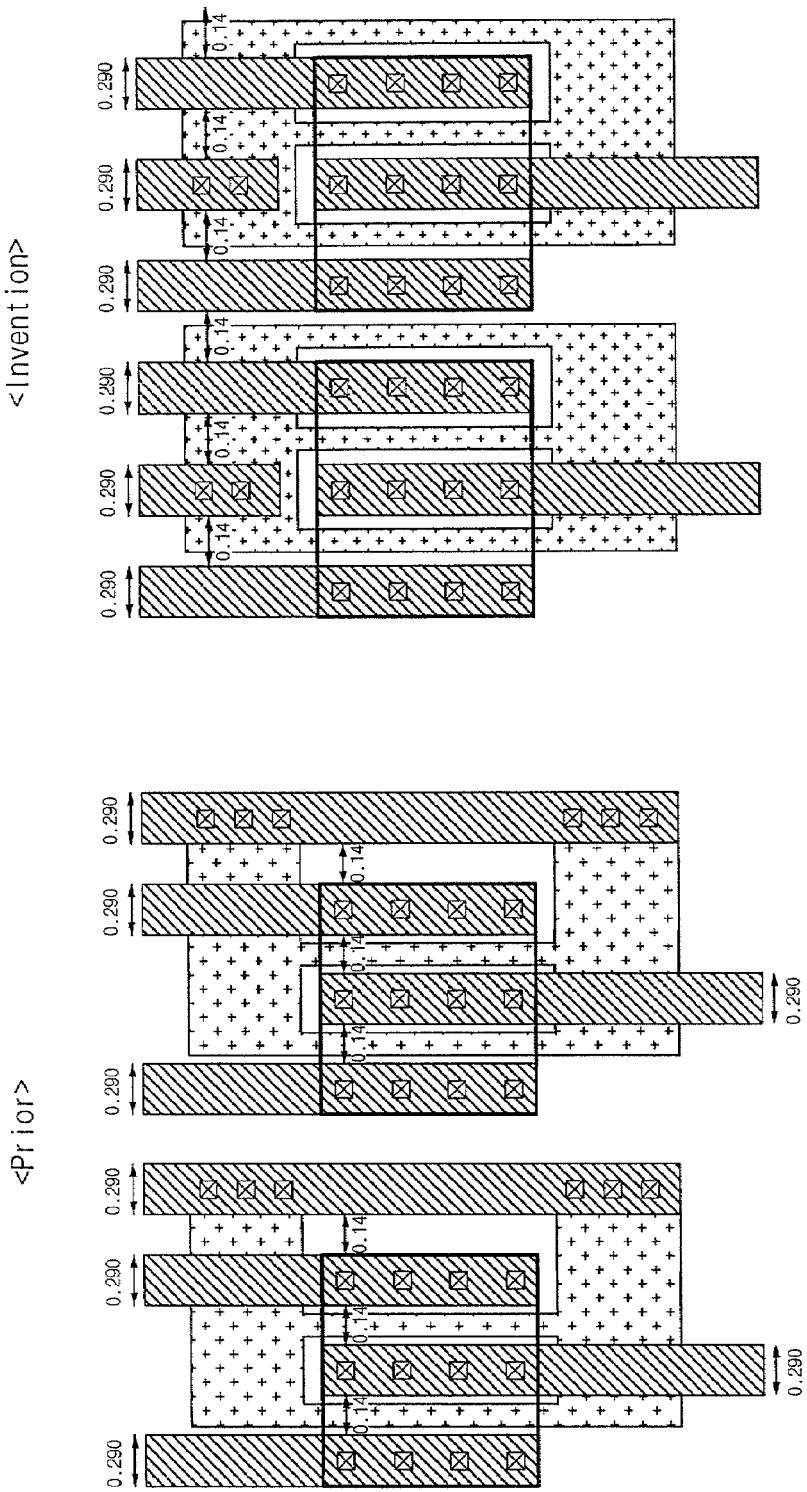
FIG. 6 is a layout for comparing the sizes of semiconductor devices in a peripheral circuit region in accordance with the prior art and the present invention.

FIG. 6 is layouts illustrating the size of a semiconductor device in a peripheral circuit region in accordance with the prior art and the size of a semiconductor device in a peripheral circuit region in accordance with the present invention.

As shown, it can be appreciated that the size of the semiconductor device in a peripheral circuit region in accordance with the present invention is reduced by about 20% in comparison to the semiconductor device in a peripheral circuit region in accordance with the prior art.

Also, in an embodiment of the present invention, since the dummy gate is formed between the active areas, the distance between the gate and the metal wiring can be kept uniform. The dummy gate is also helpful in the stabilization of the gate pattern when forming the gate pattern.

Figure 7:
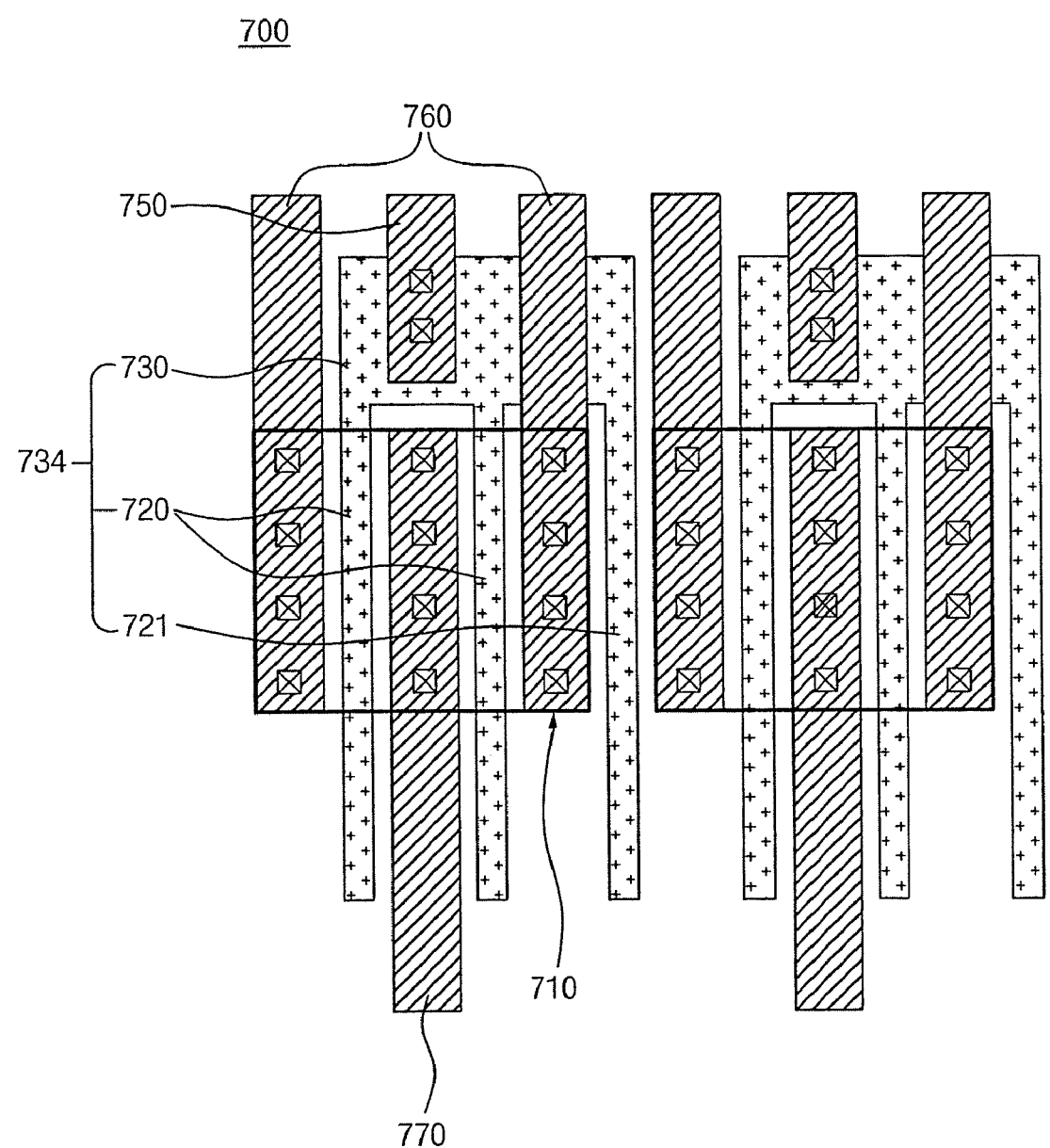
FIG. 7 is a layout illustrating a semiconductor device in a peripheral circuit region in accordance with a fourth embodiment of the present invention.

FIG. 7 is a layout illustrating a semiconductor device in a peripheral circuit region in accordance with a fourth embodiment of the present invention.

As shown, the semiconductor device in a peripheral circuit region has a structure including a semiconductor substrate 200 having a plurality of active areas 710 that are disposed distantly from each other. The device further includes a gate pattern having at least one gate 720 disposed at the active area 710, a pad 730 connected to either side portions of the gates 720 and dummy gate 721, and a first wiring 750 that is formed to contact the pad 730.

In the semiconductor device in a peripheral circuit region in accordance with the present invention as described above, when forming the gate pattern 734, the gate 720 disposed within the active areas 710 is turned on by connecting the pad 730 through the dummy gate 721.

Figure 8A:
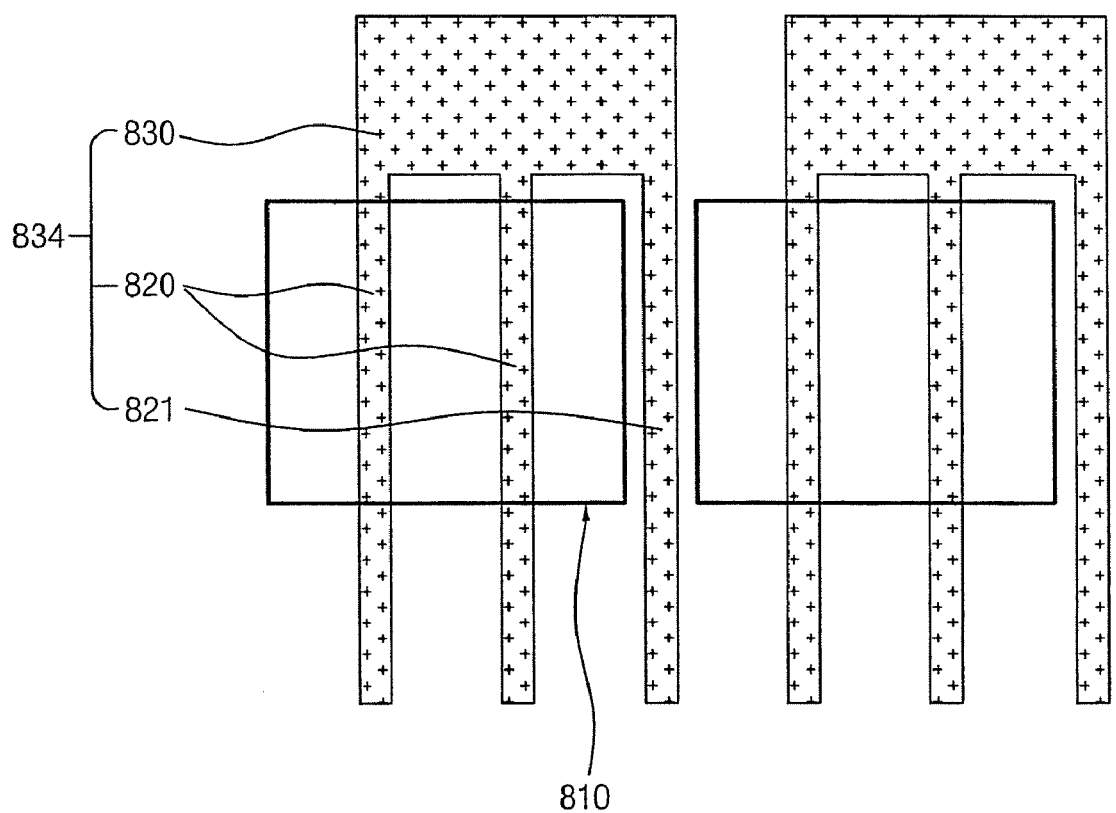
FIGS. 8A through 8C are layouts illustrating the process for manufacturing the semiconductor device in a peripheral circuit region in accordance with the fourth embodiment of the present invention.
Figure 8B:
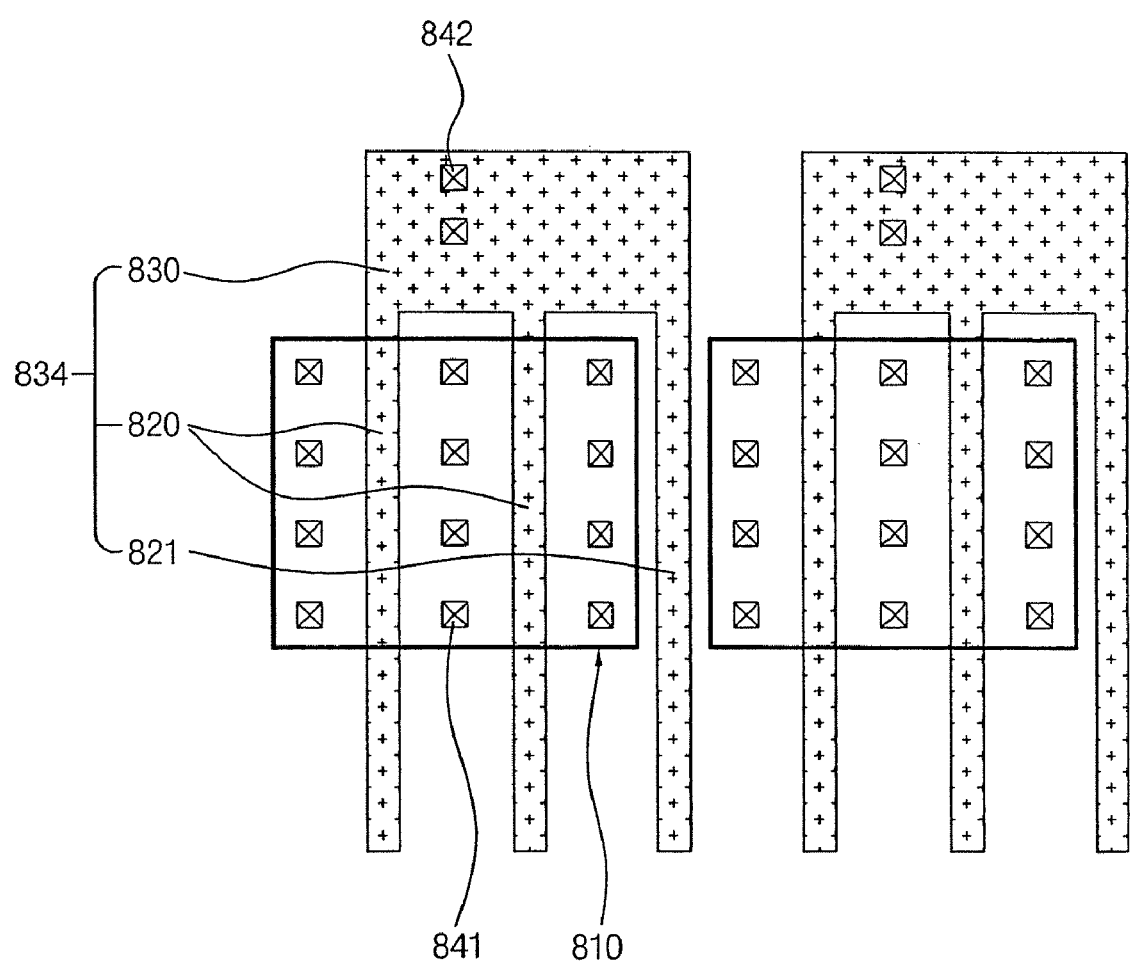
Figure 8C:
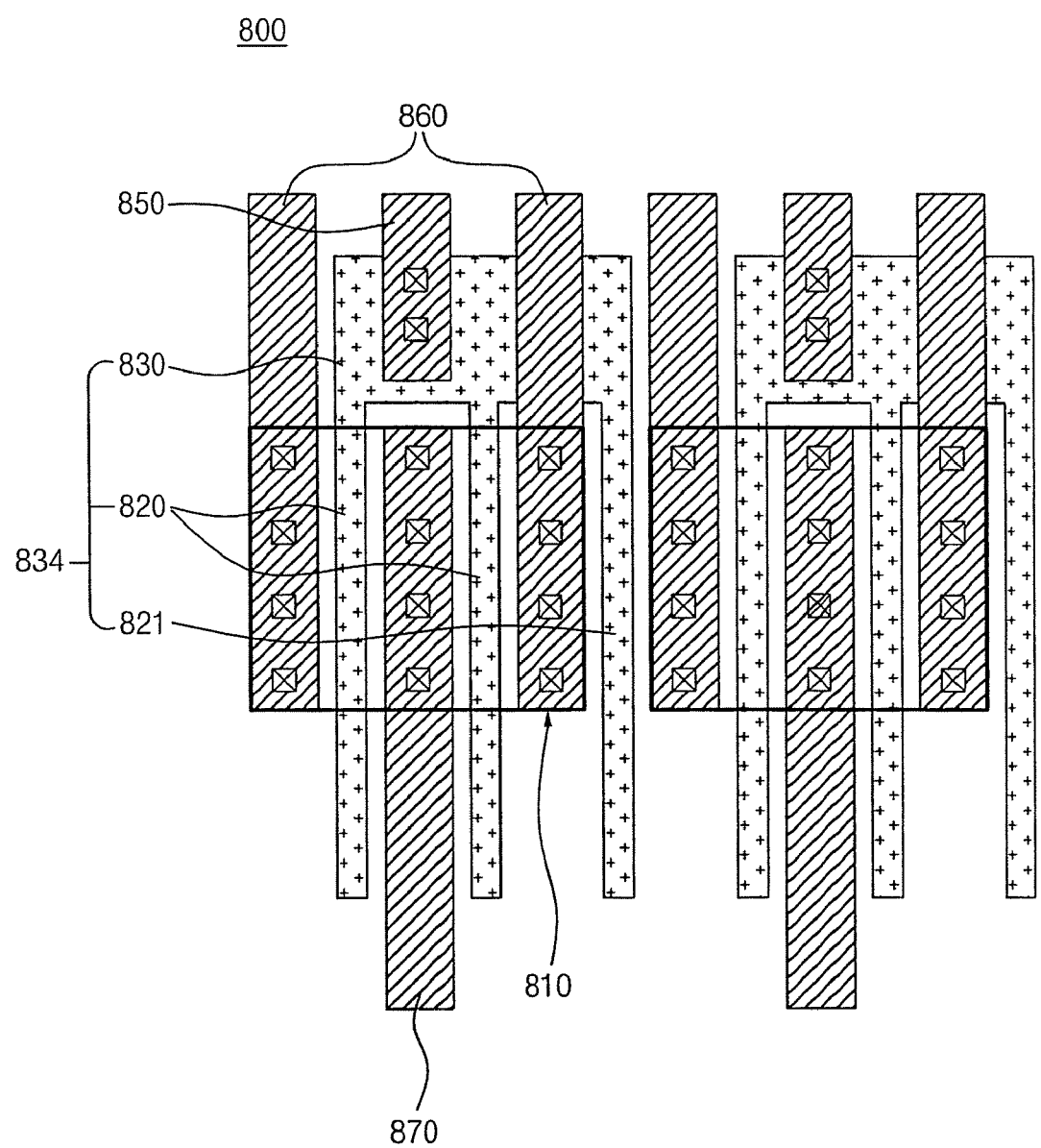

FIGS. 8A through 8C are layouts illustrating the process steps for manufacturing the semiconductor device in a peripheral circuit region in accordance with the fourth embodiment of the present invention and a detailed description with reference to the drawings will be made.

Referring to FIG. 8A, at least one gate 820 is formed on each active area 810 of a semiconductor substrate 800 having a plurality of active areas 810 which are disposed distantly from each other. Preferably, the gate 820 is formed in pairs in the active area. A dummy gate 821 is formed having the same width and length as the gate 820 between the active areas 810. The space between the gates 820 and the space between the gate 820 and the dummy gate 821 are equal.

The space between the dummy gate 821 disposed at one active area 810 and a gate disposed at a second active area 810 adjacent to the dummy gate 821 is equal to the space between the gates 820 disposed on one active area 810 and the space between the gate 820 and the dummy gate 821. Thus, spaces between the gates 820 can be kept uniform as the dummy gate 821 is disposed.

A pad 830 is formed to connect either side portions of the gates 820 and the dummy gate 821, thereby forming a gate pattern 834 including the gate 820, the dummy gate 821 and the pad 830. Subsequently, a source/drain area (not shown) is formed in the active area 810 at both sides of the gate 820.

Referring to FIG. 8B, there is a first contact 841 for metal wiring that is in contact with the source/drain area of the semiconductor substrate 800. The first contact 841 for metal wiring is formed so that at least one spot thereof is in contact with the active area 810 along a direction perpendicular to the active area 810. Preferably, the first contact 841 for metal wiring is formed to contact three spots of the active area 810 along the direction of the active area 810 and in contact with four spots of the active area 810 along a direction perpendicular to the active area 810. A second contact 842 for metal wiring is formed on the pad 830. The second contact 842 for metal wiring is formed to contact two spots of the pad 830.

Referring to FIG. 8C, a first wiring 850 is formed to contact at least one spot of the second contact 842 for metal wiring formed on the pad 830. Preferably, the first wiring 850 is formed to contact two spots of the pad 830. A second wiring 860 and a third wiring 870 are formed and disposed at both sides of the gate 820 and to contact the active area 810. Preferably, the second wirings 860 are formed as a pair outside of the gates 820 to contact the source area. The third wiring 870 is formed between the pair of gates 820 to contact the drain area.

The second wirings 860 and the third wiring 870 are arranged with equal spacing. In addition, the spacing among the first wiring 850, the second wirings 860 and the third wiring 870 are equal to one another. Also, the spacing among the first wiring 850, the second wirings 860 and the third wiring 870 are equal to a space between the active areas 810. Further, since the second wirings 860 and the third wiring 870 are formed on the first contact 841 for metal wiring, the second wirings 860 and the third wiring 870 are in contact with four spots of the active area 810 respectively.

Afterwards, though not shown, a series of known follow-up processes are sequentially performed, thereby manufacturing the semiconductor device in a peripheral circuit region in accordance with the fourth embodiment of the present invention.

As described above, in the semiconductor device in a peripheral circuit region in accordance with the fourth embodiment of the present invention, the second and third wirings 860 and 870 are formed at both sides of the gate 820 to contact the active area 810. However, in a fifth embodiment of the present invention, as shown in FIG. 9, a second wiring 960 alone may contact the active area 510 and be disposed between a gate 920 and a dummy gate 921 and also between the dummy gate 921 and gate 920 disposed on another active area 910 adjacent thereto.

Figure 9:
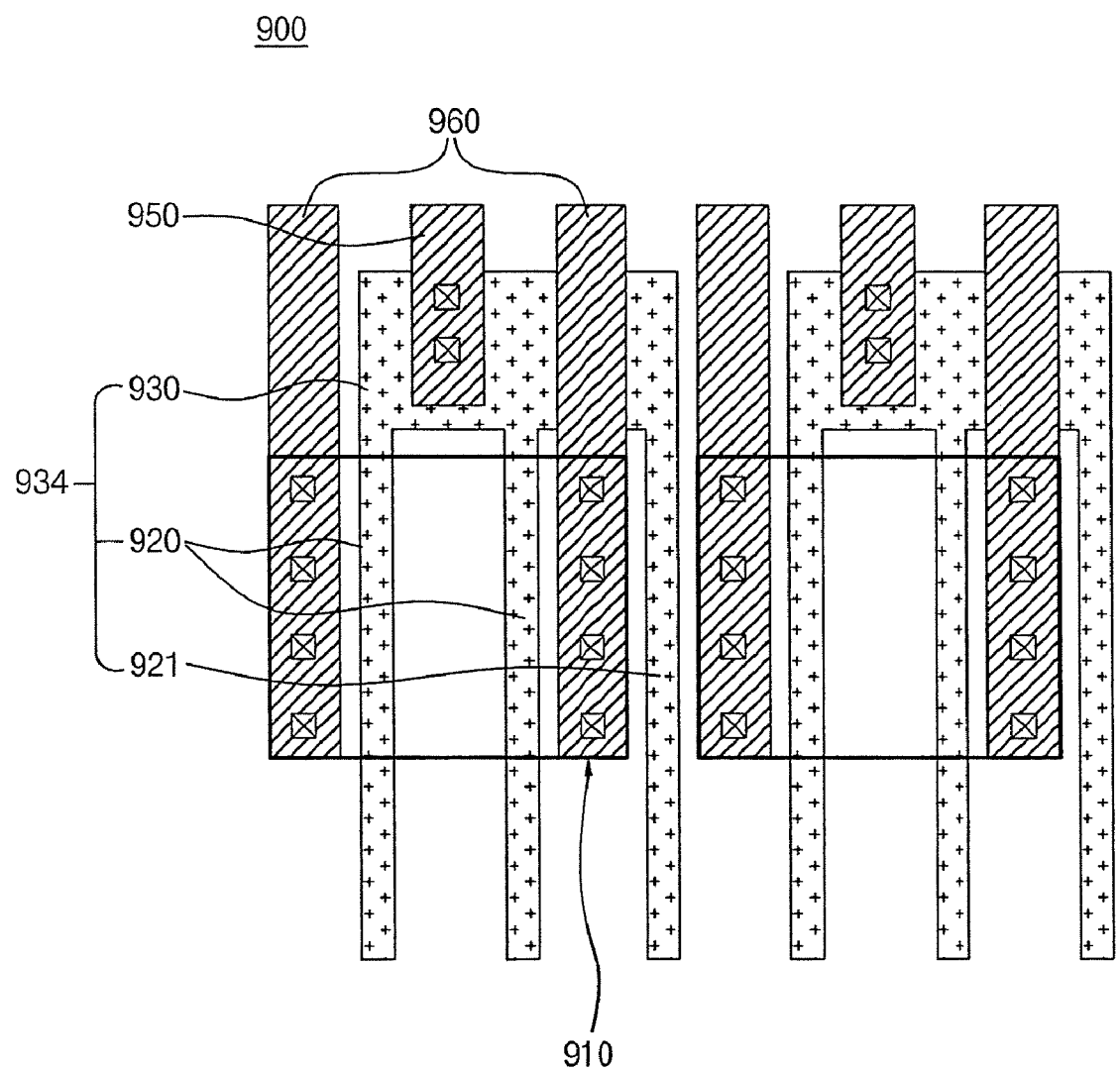
FIG. 9 is a layout illustrating a semiconductor device in a peripheral circuit region in accordance with a fifth embodiment of the present invention.

In FIG. 9, reference symbols 900, 930, 934 and 950, which are not explained, denote a semiconductor substrate, a pad, a gate pattern and a first wiring, respectively.

As described above, in the semiconductor devices in a peripheral circuit region in accordance with the first to fourth embodiments of the present invention, a pair of the gates is formed in the active area when forming the gate pattern. However, in a sixth embodiment of the present invention, as shown in FIG. 10, a single gate may be formed in the active area 1010 when forming the gate pattern 1034.

Figure 10:
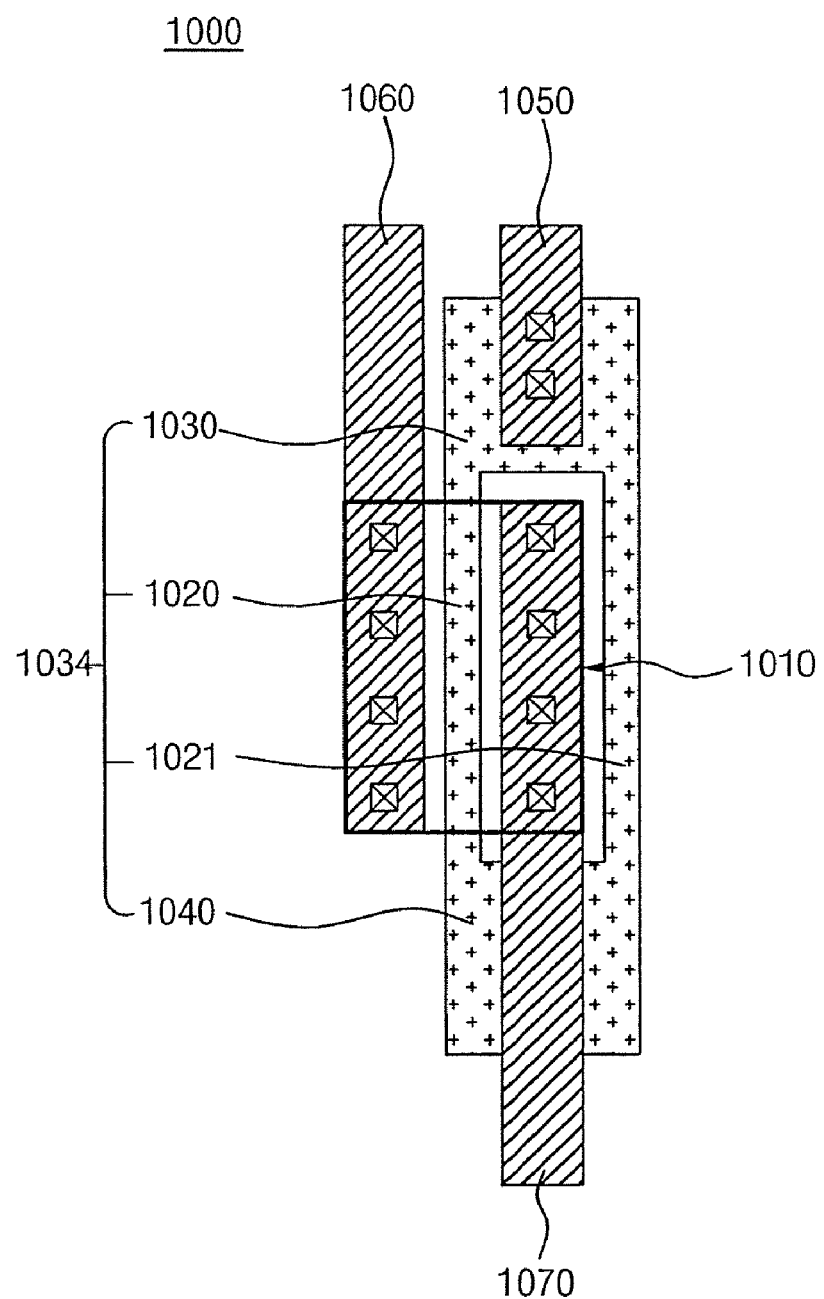
FIG. 10 is a layout illustrating a semiconductor device in a peripheral circuit region in accordance with a sixth embodiment of the present invention.

In FIG. 10, reference symbols 1000, 1020, 1021, 1034, 1050, 1060 and 1070, which are not explained, denote a semiconductor substrate, a gate, a dummy gate, a gate pattern, a first wiring, a second wiring and a third wiring, respectively.

Figure 11:
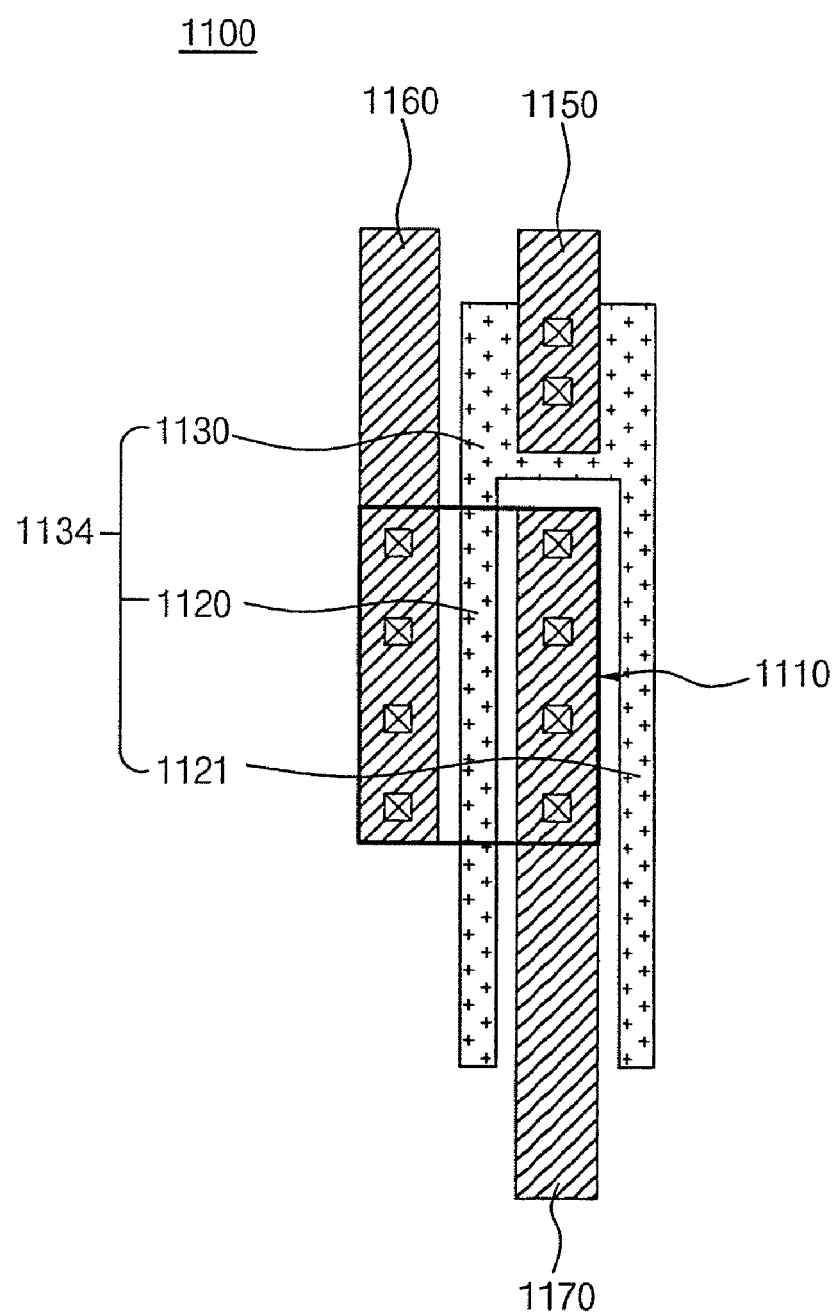
FIG. 11 is a layout illustrating a semiconductor device in a peripheral circuit region in accordance with a seventh embodiment of the present invention.

FIG. 11 is a layout illustrating a semiconductor device in a peripheral circuit region in accordance with a sixth embodiment of the present invention. As shown, where a single gate is formed in the active area, the semiconductor device in a peripheral circuit region may be formed with a gate pattern 1134 having a single gate 1120 formed in the active area 1110, a dummy gate 1121 formed between the active areas 1110, and a pad 1130 connected to either portion of the gate 1120 and the dummy gate 1121.

In FIG. 11, reference symbols 1100, 1150, 1160 and 1170, which are not explained, denote a semiconductor substrate, a first wiring, a second wiring, and a third wiring, respectively.

Afterwards, though not shown, a series of known follow-up processes are sequentially performed, thereby manufacturing the semiconductor device in a peripheral circuit region in accordance with an embodiment of the present invention.

As is apparent from the above description, in an embodiment of the present invention, since a dummy gate is formed between the active areas of a semiconductor substrate when forming a gate pattern, it is possible to adjust a disposition of a metal wiring connected with a pad which thereby allows the reduction of the total size of a semiconductor device. Also, in an embodiment of the present invention, it is possible to maintain uniform distances between a gate and a metal wiring by forming the dummy gate. Furthermore, in an embodiment of the present invention, the forming of the dummy gate is helpful in stabilization of the gate pattern.

Although specific embodiments of the present invention have been described for illustrative purposes, those skilled in the art will appreciate that various modifications, additions, and substitutions are possible without departing from the scope and the spirit of the invention as disclosed in the accompanying claims.

What is claimed is:

1. A semiconductor device in peripheral circuit region comprising:
   a semiconductor substrate having a plurality of active areas which are disposed distantly from each other;
   a gate pattern including at least one gate disposed on the active area, a dummy gate disposed between the active areas and first and second pads electrically connected to the gate and the dummy gate on side portions of the gate and the dummy gate thereon; and
   a first wiring formed so as to be in contact with at least one of the first and second pads.

2. The semiconductor device in peripheral circuit region according to claim 1, wherein the dummy gate has the same width and length as the gate.

3. The semiconductor device in peripheral circuit region according to claim 1, wherein a space between the gates and a space between the gate and the dummy gate are equal.

4. The semiconductor device in peripheral circuit region according to claim 1, wherein a space between the dummy gate and a gate disposed on another active area adjacent to the dummy gate is equal to a space between the gates disposed on the one active area.

5. The semiconductor device in peripheral circuit region according to claim 1, wherein at least one spot of the first wiring is in contact with either of the first and the second pads.

6. The semiconductor device in peripheral circuit region according to claim 1, further comprising a second wiring and a third wiring disposed at both sides of the gate and be in contact with the active area.

7. The semiconductor device in peripheral circuit region according to claim 6, wherein the first wiring is disposed on a line extending from one of the second wiring and the third wiring which crosses over the first or second pad.

8. The semiconductor device in peripheral circuit region according to claim 6, wherein the second wiring and the third wiring are arranged with equal spaces.

9. The semiconductor device in peripheral circuit region according to claim 1, further comprising a second wiring disposed between the gate and the dummy gate and between the dummy gate and the gate disposed on another active area adjacent thereto and be in contact with the active area.

10. A semiconductor device in peripheral circuit region comprising:

a semiconductor substrate having a plurality of active areas which are disposed distantly from each other;

a gate pattern including at least one gate disposed on the active area, a dummy gate disposed between the active areas and a pad electrically connected to the gate and the dummy gate on side portions of the gate and the dummy gate thereon; and a first wiring formed so as to be in contact with a portion of the pad corresponding to either of a first area between the gates and a second area between the gate and the dummy gate.

11. The semiconductor device in peripheral circuit region according to claim 10, wherein the dummy gate has the same width and length as the gate.

12. The semiconductor device in peripheral circuit region according to claim 10, wherein a space between the gates and a space between the gate and the dummy gate are equal.

13. The semiconductor device in peripheral circuit region according to claim 10, wherein a space between the dummy gate and a gate disposed on another active area adjacent to the dummy gate is equal to a space between the gates disposed on the one active area.

14. The semiconductor device in peripheral circuit region according to claim 10, wherein the first wiring is in contact with at least one spot of the pad.

15. The semiconductor device in peripheral circuit region according to claim 10, further comprising a second wiring and a third wiring disposed at both sides of the gate and be in contact with the active area.

16. The semiconductor device in peripheral circuit region according to claim 15, wherein the second wiring and the third wiring are arranged with equal spaces.

17. The semiconductor device in peripheral circuit region according to claim 10, further comprising a second wiring disposed between the gate and the dummy gate and between the dummy gate and the gate disposed on another active area adjacent thereto and be in contact with the active area.

* * * * *